(12) United States Patent
Nakajima et al.

(10) Patent No.: US 6,745,092 B2
(45) Date of Patent: Jun. 1, 2004

(54) PRODUCT MANAGEMENT SYSTEM, AND HOST COMPUTER AND RECORDED MEDIUM USED IN THE SYSTEM

(75) Inventors: Koichi Nakajima, Kitabaraki (JP); Noriyuki Yajima, Kitaibaraki (JP); Kenichi Watatani, Kitaibaraki (JP)

(73) Assignee: Nikko Materials Co., Ltd., Tokyo (JP)

( * ) Notice: Subject to any disclaimer, the term of this patent is extended or adjusted under 35 U.S.C. 154(b) by 78 days.

(21) Appl. No.: 10/181,269
(22) PCT Filed: Sep. 13, 2001
(86) PCT No.: PCT/JP01/07937
§ 371 (c)(1), (2), (4) Date: Jul. 16, 2002
(87) PCT Pub. No.: WO02/41206
PCT Pub. Date: May 23, 2002

(65) Prior Publication Data
US 2003/0014140 A1 Jan. 16, 2003

(30) Foreign Application Priority Data
Nov. 16, 2000 (JP) .......................................... 2000-349139

(51) Int. Cl.⁷ .............................................. G06F 19/00
(52) U.S. Cl. ............................. 700/117; 700/9; 700/20; 700/97; 700/121
(58) Field of Search ................................ 700/9, 20, 97, 700/117, 121; 204/192.1; 219/121.15; 257/E21.462, 411; 427/524; 505/475, 476, 816; 709/238, 248, 249, 312

(56) References Cited

U.S. PATENT DOCUMENTS 6,576,967 B1 * 6/2003 Schaeffer et al. ........... 257/411

FOREIGN PATENT DOCUMENTS

JP          2000-35994         2/2002

* cited by examiner

Primary Examiner—Leo Picard
Assistant Examiner—Carlos R. Ortiz
(74) Attorney, Agent, or Firm—Birch, Stewart, Kolasch & Birch, LLP (57) ABSTRACT

The product management system for sputtering targets is configured between a target manufacturer and target customers via a computer network. The customer and the manufacturer share the various information relating to the product management, such as hysteresis information of the backing plates, product information of the sputtering targets, use information of the sputtering targets, or the like with each other.

11 Claims, 7 Drawing Sheets

(A) TARGET USE INFORMATION

| NO. | DELIVERY DATE | START DATE OF USE | ESTIMATED DATE OF COMPLETION | USED BP IDENTIFICATION INFORMATION | JUDGMENT |
|---|---|---|---|---|---|
| 0001 | 00.08.11 | 00.08.14 | 00.09.14 | A0001 | ○ |
| 0002 | 00.08.11 | 00.08.14 | 00.09.14 | A0002 | ○ |
| 0003 | 00.08.11 | 00.08.14 | 00.09.14 | A0003 | × |
| 0004 | 00.08.11 | 00.08.14 | 00.09.14 | A0004 | ○ |
| 0005 | 00.08.11 | 00.08.14 | 00.09.14 | A0005 | △ |
| ⋮ | ⋮ | ⋮ | ⋮ | ⋮ | ⋮ |

(B) TARGET PRODUCTION INFORMATION

| NO. | DATE OF ORDER RECEIVED | DELIVERY DATE | PRODUCTION STEP | ESTIMATED DATE OF STEP END | USED BP IDENTIFICATION INFORMATION |
|---|---|---|---|---|---|
| 1001 | 00.08.11 | 00.10.11 | RAW MATERIAL POWDERS MANUFACTURE | 00.08.25 | A0001 |
| 1002 | 00.08.11 | 00.10.11 | RAW MATERIAL POWDERS MANUFACTURE | 00.08.25 | A0002 |
| 1003 | 00.08.11 | 00.10.11 | RAW MATERIAL POWDERS MANUFACTURE | 00.08.25 | A0003 |
| 1004 | 00.08.11 | 00.10.11 | RAW MATERIAL POWDERS MANUFACTURE | 00.08.25 | A0004 |
| 1005 | 00.08.11 | 00.10.11 | RAW MATERIAL POWDERS MANUFACTURE | 00.08.25 | A0005 |
| ⋮ | ⋮ | ⋮ | ⋮ | ⋮ | ⋮ |

(C) BP INFORMATION

| BP IDENTIFICATION NUMBER | USAGE COUNT |
|---|---|
| A0001 | 23 |
| A0002 | 11 |
| A0003 | 16 |
| A0004 | 26 |
| A0005 | 18 |
| ⋮ | ⋮ |

A0001 DETAIL

| | USE DATE | TARGET | EVALUATION AT REPROCESS |
|---|---|---|---|
| 1 | 90.05.11 | ITO | ◎ |
| 2 | 91.12.11 | ITO | ◎ |
| 3 | 92.07.11 | Al | ◎ |
| 4 | 93.02.11 | ITO | ◎ |
| 5 | 93.02.11 | ITO | ◎ |
| ⋮ | ⋮ | ⋮ | ⋮ |

TA TARGET MATERIAL

BP BACKING PLATE

ST SPUTTERING TARGET

PRODUCT MANAGEMENT SYSTEM, AND HOST COMPUTER AND RECORDED MEDIUM USED IN THE SYSTEM

This application is the national phase under 35 U.S.C. § 371 of PCT International Application No. PCT/JP01/07937 which has an International filing date of Sep. 13, 2002, which designated the United States of America.

TECHNICAL FIELD

The present invention relates to a useful system applied to production processes for sputtering targets with process of reuse of backing plates. Particularly, the present invention relates to a product management system for sputtering targets, and a host computer and a program for the system capable of smoothly transmitting and receiving various information via the data communications between a target customer and manufacturer to improve the production efficiency of the sputtering targets.

BACKGROUND ART

As a method for forming a thin film on a substrate, there is a sputtering method. The sputtering method is the one that thin film material which is called a sputtering target is collided with ions, such as $Ar^+$, to sputter the target surface, and the sputtered particles from the target are deposited on the substrate disposed on a predetermined position, so that the thin film is formed on the substrate.

Figure 7:
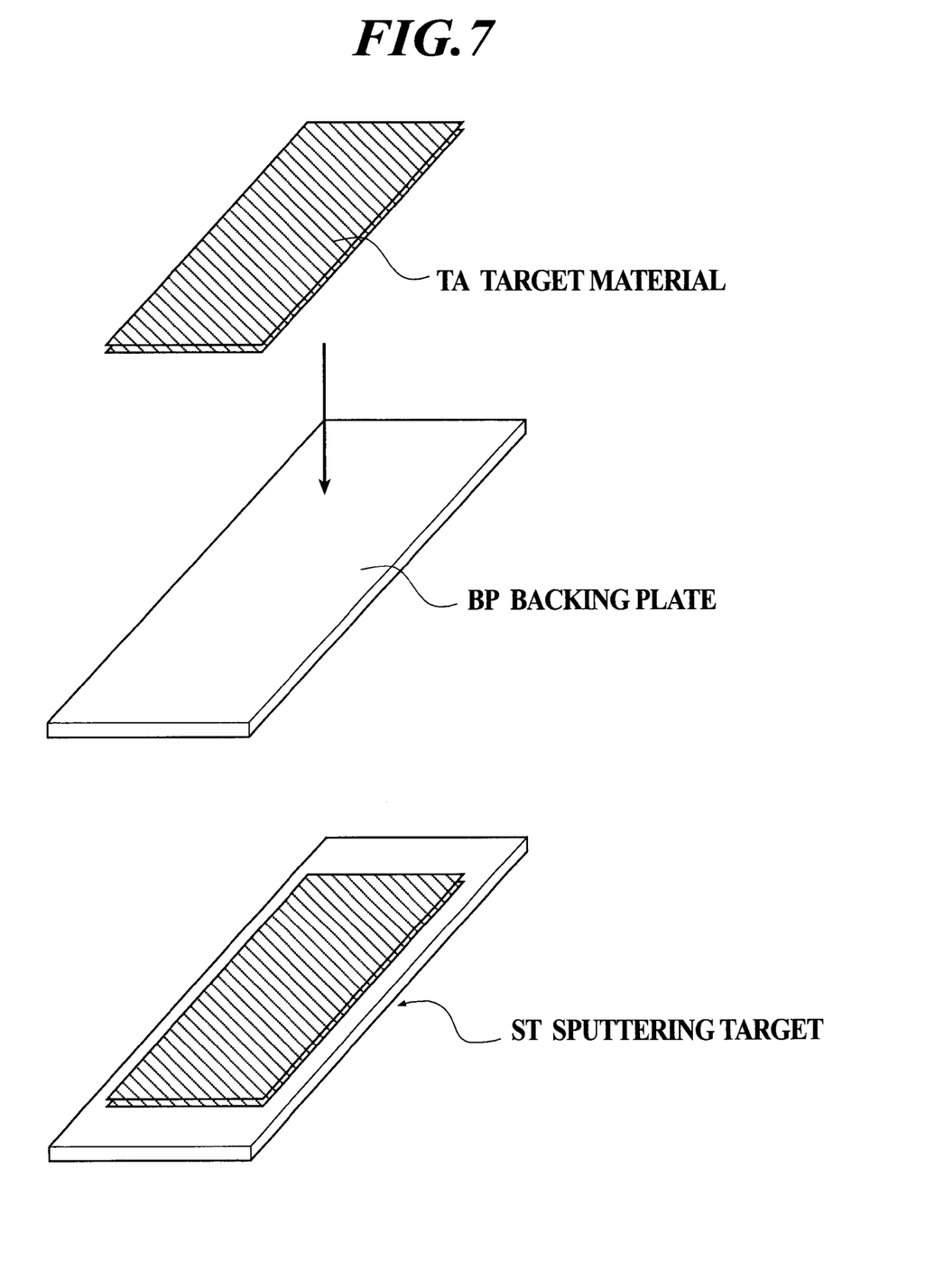
FIG. 7 is a schematic view of the sputtering target.

The sputtering target ST, as shown in FIG. 7, comprises a base which is called a backing plate BP and the target material TA adhered to the backing plate BP. The target material TA is, for example, produced by forming raw material powders for the target, and then sintering the formed product. After the sputtering target ST is used for the sputtering and the target material TA of the sputtering target ST is eroded away near the backing plate BP surface, the target material TA remained on the backing plate BP is removed from the sputtering target ST. Then, the backing plate BP is reprocessed, and a new target material TA is adhered to the reprocessed backing plate BP for reusing the backing plate BP.

In general, the backing plate is made of pure copper or cupreous alloy, in rare cases, stainless steel.

Heretofore, the sputtering targets are renewed by the manufacturer of sputtering target (hereinafter, it is simply referred to as a manufacturer) which receives an order from the customer of sputtering target (hereinafter, it is simply referred to as a customer). The manufacturer starts the production of the sputtering targets only after the customer orders. The customer prepares the backing plates based on the number of the ordered sputtering targets, and sends them to the manufacturer. The manufacturer starts making the raw material powders of the target according to the order, and forms the target materials out of the raw material powders. Thereafter, the manufacturer adheres the target material to the backing plate to produce the sputtering target, and delivers the sputtering target as a final product to the customer.

The backing plate is repeatedly reusable. The sputtering target spent by the customer is sent to the manufacturer again, and the residual target material is removed from the backing plate. Thereafter, an adhering surface of the backing plate is cleaned (reprocess of the backing plate), and the reprocessed backing plate is reused as the base of the sputtering target again.

Figure 6:
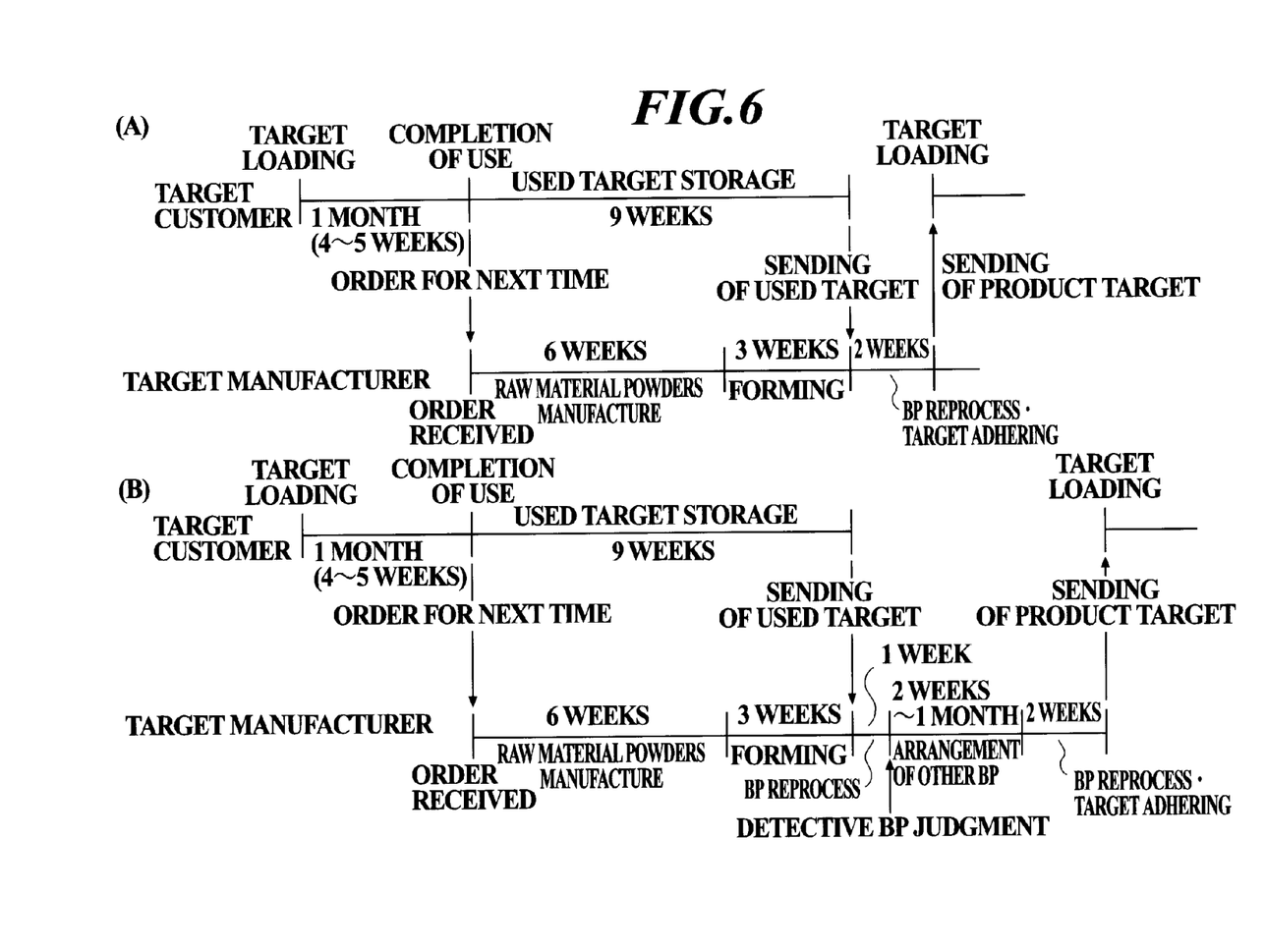
FIG. 6 are explanatory illustrations of a sputtering target production process according to the earlier technique.

FIG. 6(A) is an explanatory illustration showing a general production process of sputtering target.

At first, for example, hundred pieces of product target group delivered from the manufacturer to the customer are loaded onto a hundred of sputtering apparatus on the customer. Normally, the sputtering targets loaded onto the apparatus are completely spent within four or five weeks. The customer orders the sputtering targets for next time just before or after the complete consumption of the sputtering targets.

The manufacturer begins to arrange the raw materials for targets according to the order from the customer. The producing of raw material powders takes for the manufacturer about 6 weeks, and forming and sintering of the targets takes about three weeks under the present circumstances. In the meantime, the customer arranges sending of the spent sputtering targets, and then sends the spent sputtering targets in accordance with the time that the manufacturer has just formed and sintered the targets.

The manufacturer removes the residual target material from the spent sputtering target sent from the customer, and cleans the backing plate. Thus, the backing plate is reprocessed. The reprocessed backing plate is inspected whether it is reusable or not. When the reuse is possible, the newly formed target material is adhered to the backing plate. Then the product sputtering targets are sent to the customer. It takes about two weeks for the manufacturer from the reprocess of the backing plate to the adhering of target material. As described above, it takes at least about 11 weeks from the order of the sputtering targets by the customer to the delivery of the sputtering targets by the manufacturer in the general process of sputtering target production under the present circumstances.

On the other hand, as a result of the inspection, if it is judged that the reuse of the reprocessed backing plate is impossible, as shown in FIG. 6(B), the customer or the manufacturer arranges other backing plates in about two weeks to one month. That is, spares or stocks of the backing plate are sent to the manufacturer, or if there is no spare, the backing plates are newly manufactured at this time. The delivery is delayed for the arrangement for other backing plates. It takes about 14 to 16 weeks from the order of the targets by the customer to the delivery by the manufacturer.

Figure 5:
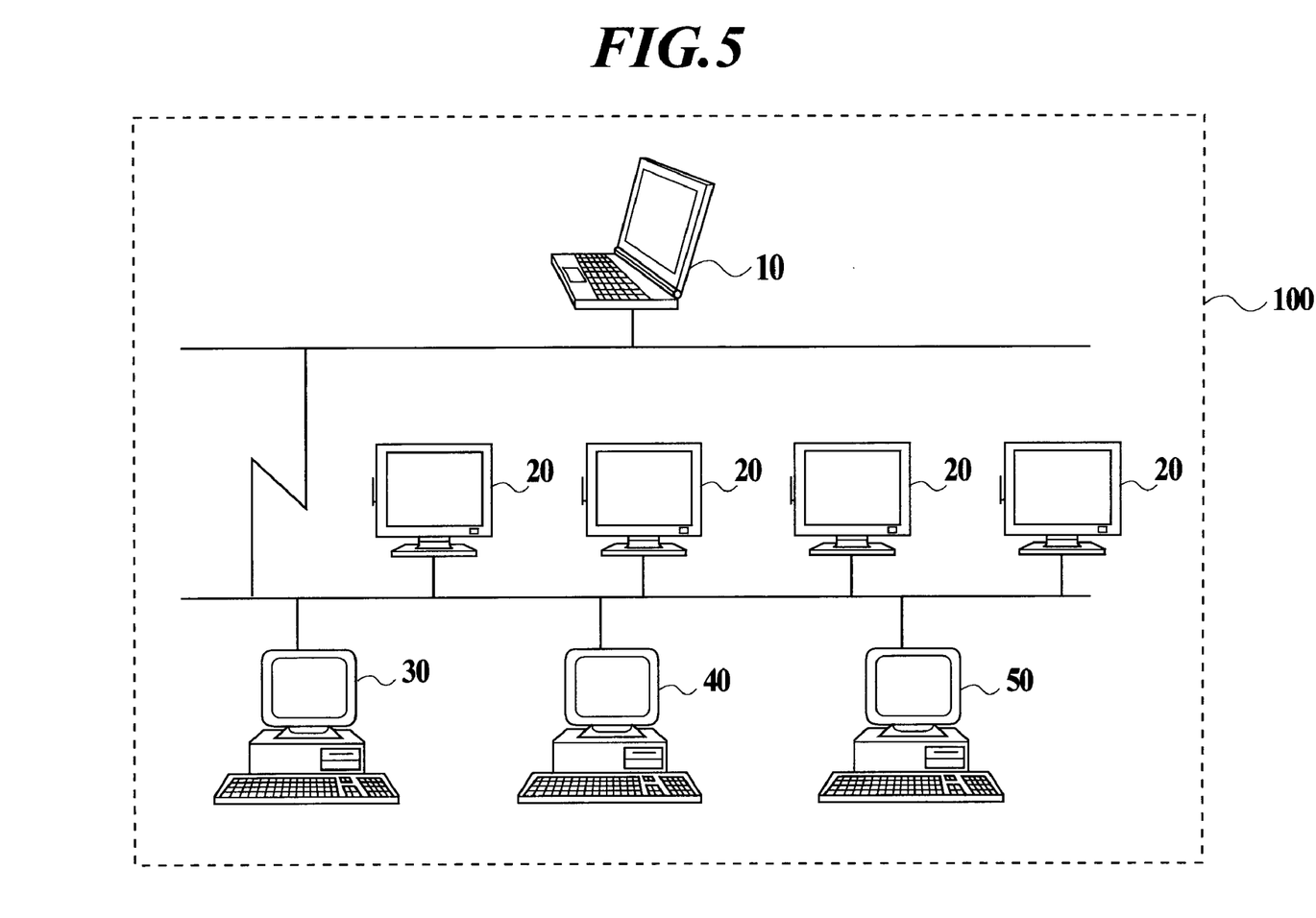
FIG. 5 shows a product management system on the manufacturer according to the earlier technique.

FIG. 5 is a block diagram showing a system configuration of the product management system on the manufacturer. A reference numeral 10 denotes a communication terminal device inputting or recording the order of the sputtering targets from the customer, and for example, provided on the sales division or the like on the manufacturer. A reference numeral 20 denotes a communication terminal device provided on each site (product management division, process and inspection section, forming section, raw material section, logistics section, or the like) of the factory. These communication terminal devices 10 and 20 are connected to an intranet server 30 and a DNS server 50 for LAN, so that the LAN within the company of manufacturer is configured. Further, a product management database server (for example, SQL server) 40 is connected to the LAN, so that the product management system in the manufacturer is configured. Thus, the information about the sputtering target product management, which is stored up in the SQL server 40 can be accessed or viewed with the respective communication terminal devices 10 and 20. As described above, the information with the electronic data about the sputtering target product management is only transmitted and received within the manufacturer in the earlier technique. The order entry from the customer, the order placement to a raw material manufacturer or the like is carried out solely by transmitting and receiving the analog data by telephone, facsimile, mail or the like.

According to the above-described production method, it takes a long time from the order entry to the delivery of the sputtering target products. In addition, the apparatus for producing sputtering targets or other apparatus in the manufacturer cannot run efficiently from the delivery to the next order, while the customer cannot use the sputtering apparatus or the like from the complete consumption of the sputtering targets to the next delivery of the new sputtering targets. Thus, the operation rate of the apparatus in the manufacturer and customer are reduced, so that the production efficiency cannot be improved.

The backing plate, whether it is reusable or not is inspected and judged only after the spent sputtering target which is sent back from the customer is reprocessed, transformed into the backing plate. Thus, when defective backing plate with a curvature or a scratch or other defects on the adhering surface, which is not found till the residual target material is removed from the backing plate, is found, the response therefore takes a long time, so that there is a case that the delivery date is further delayed.

The customer can prepare a plurality of sputtering target groups. After the first target group is completely spent, the customer loads the second sputtering target group onto the sputtering apparatus, and sends the spent first sputtering target group to the manufacturer, and then orders sputtering targets renewal. After the second target group is completely spent, the customer loads the third target group onto the sputtering apparatus, and sends the spent second sputtering target group to the manufacturer, and then orders sputtering targets renewal. In this way, if the plurality of sputtering target groups are prepared so that the sputtering target group can be loaded onto the sputtering apparatus in order, the sputtering apparatus can efficiently run. However, the customer is required to always have a great number of backing plates, which is not less than three times as many as a number of the sputtering apparatus, and to repeatedly recycle the backing plates. As a result, the problem that increase of the cost for manufacturing a great number of backing plates and for the management arises.

An object of the present invention is to provide a product management system for sputtering targets, a host computer for the same, and a medium storing a program for product management system by which the customer can use efficiently the sputtering apparatus, while the manufacturer can remarkably reduce the delivery time of the sputtering targets.

DISCLOSURE OF THE INVENTION

In order to accomplish the above object, a product management system for sputtering targets of the present invention comprises communication terminal devices on a plurality of customers ordering a sputtering target used for forming a thin film on a predetermined object by a sputtering method, a communication terminal device on a manufacturer producing a sputtering target according to an order from the customer, and a host computer managing an entire system. Each of the communication terminal devices on the customers, the communication terminal device on the manufacturer and the host computer is connected to each other via a predetermined communication network. The host computer comprises storage means for storing at least identifying information for tracking down each of the plurality of customers, identifying information for tracking down each backing plate which is used as a base of the sputtering target and to which a predetermined target material can be adhered, and hysteresis information recorded as a reused history of each backing plate. The reused history includes a usage count of the backing plate used as a sputtering target, categories of material type, quality and product class about every target material adhered to the backing plate, and a result of a judgment for scratch, curvature, or the like on the adhering surface of the backing plate to the target material at the reprocess and reuse of the backing plate, or the like. The host computer also comprises customer authentication means for determining whether a present accessor is authorized user by checking identifying information of registered customers. The communication terminal devices on the customers, when the present accessor is authenticated by the customer authentication means, are capable of accessing to the information stored in the host computer. The hysteresis information is updated with respect to each reprocess and reuse of the backing plate as a sputtering target, in accordance with the input data from the communication terminal device on the manufacturer.

According to the system, the customer can know in advance how many times the backing plate under customer's hand will be used based on the hysteresis information of the backing plates. Thus, the customer sends only the spent sputtering targets having reusable backing plates when the customer orders the next sputtering targets renewal. On the other hand, the customer prepares other backing plates in advance for nonreusable ones. Thus, the possibility of finding of the nonreusable backing plate is reduced when the backing plate is reprocessed from the spent sputtering target, and inspected by the manufacturer. Accordingly, the trouble of extension of delivery date by ordering a new backing plate is reduced.

Product information about a production status of a sputtering target is stored in the storage means. The product information is updated every advance of the production process, based on input data from the communication terminal device on the manufacturer.

Thus, the customer can confirm the production status of the ordered sputtering target at real time, so that the customer can wait the delivery of the product target at ease. When the nonreusable backing plate is found by the advance judgment for the reuse of the backing plate, the customer has only to arrange another backing plate by the end of the target forming step on the manufacturer. Therefore, the customer can arrange the backing plate in a good timing depending on the production state on the manufacturer.

Expenditure information about a sputtering target delivered from the manufacturer is stored in the storage means. The expenditure information shows the beginning of use of the sputtering target loaded onto a sputtering apparatus on the customer. It is updated every beginning of use of the sputtering target based on input data from the communication terminal devices on the customers.

Accordingly, the manufacturer can estimate the next order, so that the manufacturer can arrange the raw material and confect the raw material powders in advance. Thus, the delivery date can be advanced. The expenditure information includes, for example, the date when the sputtering target is loaded onto the sputtering apparatus, estimated date of completion of use, identifying information of the backing plate used for the sputtering target, or the like.

Preferably, a plurality of communication terminal device on the manufacturer are installed in respective divisions and sections relating to the production of the sputtering target, and each of them is connected to the host computer via communication means, such as a local area network.

The system comprises a denial mechanism and means for preventing illegal access from a communication terminal device on outsiders who have no access right to the host computer. Thereby, the information shared only by the customer and manufacturer can be protected from the illegal access from outsiders, and then securely managed.

The host computer may comprise a reprocess judgment means for judging adequacy of reuse of the backing plate based on the hysteresis information. A program for judging adequacy of reuse of the backing plate based on the hysteresis information may be stored in the storage means. Then, the program may be executed, for example, when the judgment for the reuse is required.

The customer can judge whether the backing plate to be used for the next target is reusable from the hysteresis information. In addition, the manufacturer confirms whether the backing plate is reusable, thereby nonreusable backing plate is not sent. Further, the adequacy of reuse of the backing plate is automatically judged by the reuse judgment means, so that it can be surely avoided to send the nonreusable backing plate.

With respect to the automatic judgment for the adequacy of reuse of the backing plate, the adequacy can be accurately judged by using the database about the backing plates which have used. The database includes the relationship data between the usage count, the type of the adhered target material, the result of judgment for a adhering surface of the backing plate to the target material, and the adequacy of reuse of the backing plate.

The host computer may comprise production schedule planning means for planning a production schedule based on advance order information transmitted from the customer. The advance order information may include material type, quality, and product class to be used for manufacturing a next sputtering target and the identifying information of a backing plate to be used. The planned production schedule may be stored in the storage means of the host computer, and transmitted to the communication terminal device on the manufacturer. Particularly, a program for planning the production schedule of sputtering target based on the advance order information may be stored in the storage means. Then, for example, when the customer loads the sputtering targets onto the sputtering apparatus, the program may be executed soon after the advance order information is transmitted.

Accordingly, the production schedule may be sent to respective divisions or sections (for example, product management division, process and inspection section, forming section, raw material section or the like) on the manufacturer soon after the receipt of the advance order from the customer. Thereby, each division or section can prepare the target production in advance, so that the sputtering targets can be produced smoothly. The staffs in each division or section may modify the production schedule.

PREFERRED EMBODIMENT OF THE INVENTION

Hereinafter, a preferred embodiment of the present invention will be explained with reference to the drawings. In the embodiment, the communication terminal devices on the manufacturer are connected to the host computer via the LAN, while the communication terminal devices on the customer are connected to the host computer via the Internet through the telephone infrastructure. The information interchange is performed on the Web site by using a general Web browser.

Figure 1:
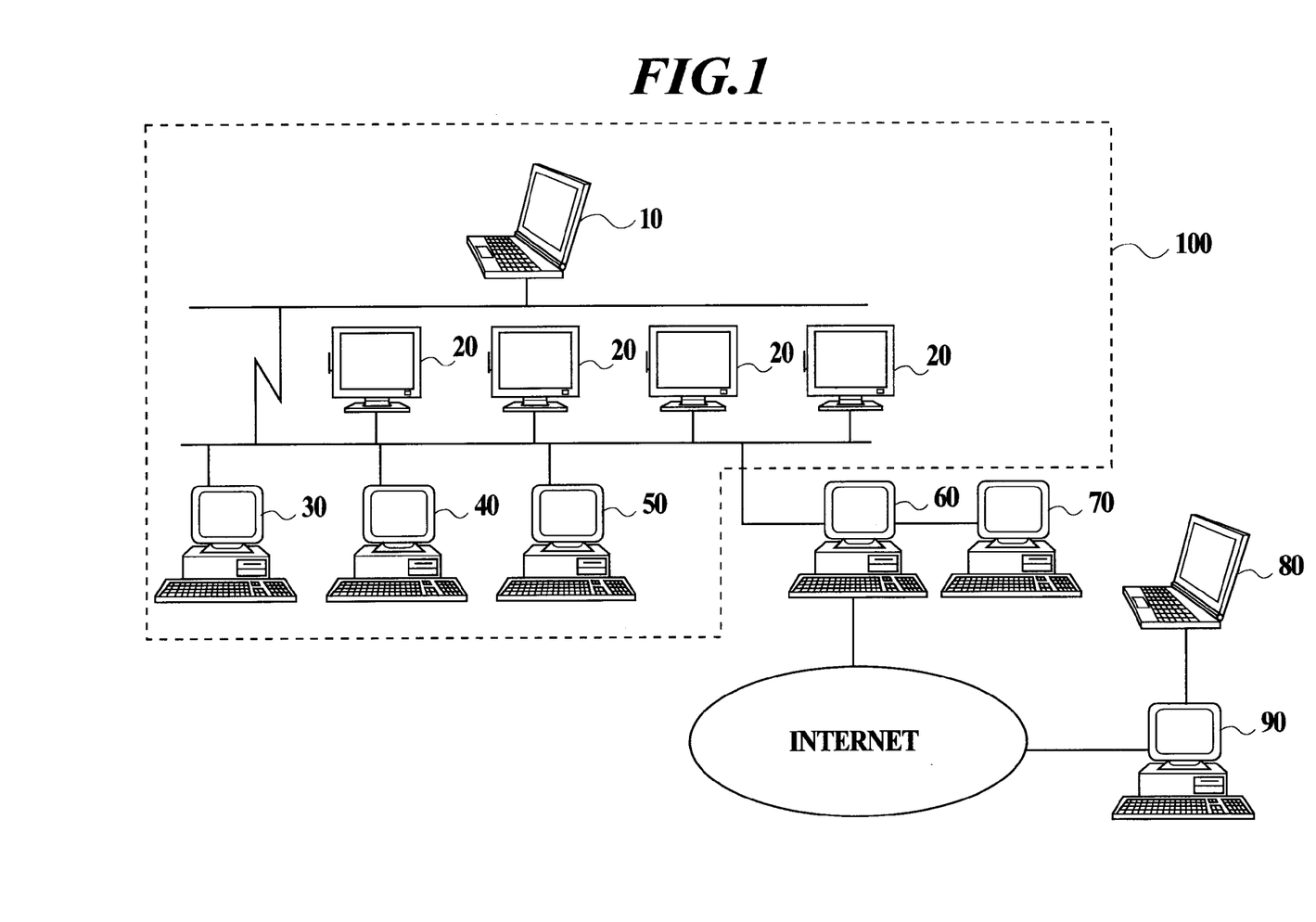
FIG. 1 is a block diagram showing a configuration of a product management system according to the present invention.

FIG. 1 is a block diagram showing a system configuration of the product management system according to the present invention. A part enclosed with a broken line 100 shows a product management system on the manufacturer, which is configured with a communication network, such as LAN, and which has the same configuration as that of FIG. 5. A reference numeral 10 denotes a communication terminal device recording or inputting the order of the targets from the customer, and for example, disposed on the sales department in the head office of the manufacturer. A reference numeral 20 denotes a communication terminal device disposed on each site (product management division, process and inspection section, forming section, raw material section, logistics section, material and resource section or the like) of the factory. General personal computers can be employed for the communication terminal devices 10 and 20.

A reference numeral 30 denotes an intranet server. A reference numeral 40 denotes a product management database server (for example, SQL server) storing the information (BP hysteresis information or the like) about the product management. A reference numeral 50 denotes a DNS server for the LAN. The respective communication terminal devices 10 and 20 and these servers 30, 40 and 50 are connected through LAN cables or the like, thereby the product management system 100 (LAN) on the manufacturer is configured.

A reference numeral 60 denotes a computer (so called a firewall) for preventing illegal access by outsiders. A reference numeral 70 denotes an Internet server for customer, which provides the product management information for the manufacturer and customer. The Internet server for customer 70 serves as a host computer in the present invention. The Internet server for customer 70 comprises at least a storage unit and a CPU. The storage unit, such as magnetic disc stores identifying information of customer (user ID and password), identifying information of backing plates, hysteresis information of backing plates and the product management program for achieving the product management system in the present embodiment. The CPU executes the product management program for displaying the various information in a web page form on a display, and for judging whether the present accessor is valid or not by referring the identifying information of registered customers. The storage medium may be a magnetic storage medium, optical storage medium, magneto-optical storage medium, or a semiconductor memory. Various types of storage mediums can be applied to the ones. For example, the storage medium may be fixedly set in the storage unit, or detachably attached thereto.

In this embodiment, the firewall 60 is configured by using the exclusive computer. However, the firewall may be configured by installing software and firmware which prevent the illegal access by outsiders to the host computer.

The product management system 100 in the manufacturer and the Internet server for customer 70 are connected to the Internet via the firewall 60, thereby the illegal access by outsiders can be prevented, so that the security is improved.

On the other hand, the communication terminal device 80 on the customer is connected to the Internet via the Internet server 90, and connected to the Internet server for customer 70 on the manufacturer via the firewall 60. The communication terminal device 80 is a general personal computer.

After the communication terminal device 80 is connected to the Internet server for customer 70, and when the customer accesses to the information about own sputtering targets, the customer is required to input the identifying information of registered customers (user ID and password). The information about own sputtering targets is provided only after the input the identifying information is checked and it is authenticated that the present accessor is the valid user. At that time, coding the user ID and password by combining public key and encryption key for transmitting and receiving the user ID and password can further improve the security.

After the present accessor is authenticated as the valid user, the accessor can get the expenditure information (including target identifying number, start date of use or the like) about the sputtering targets delivered to the customer, the target product information showing the production state or the like of the next targets ordered by the customer, the backing plate information on the customer, and other information. If encrypted above information is transmitted and received, it is possible to prevent interception by outsiders on the Internet.

As described above, the product management system in the embodiment is configured by connecting the communication terminal devices 10 and 20 on the manufacturer and the communication terminal device 80 on the customer to the Internet server for customer 70 (host computer). The various information about product management is stored in the Internet server for customer 70. The product management information can be viewed in the web page form from the communication terminal devices 10 and 20 on the manufacturer and the communication terminal device 80 on the customer. Some data of information can be written (updated).

The product management information stored in the Internet server for customer 70 includes, for example, the identifying information of registered customers, the expenditure information about the sputtering targets delivered to the customers, the product status information of sputtering targets, the reprocess information of backing plate (BP), the result of judgment for backing plate (BP) reusability, or the like. The identifying information of registered customers, the reprocess information of BP, the product status information of sputtering target, the result of judgment for BP reusability are updated by the communication terminal devices on the manufacturer, while the expenditure information about sputtering targets delivered to the customers is updated by the communication terminal device on the customer.

Alternatively, the following configuration may be possible. That is, the product management information may be stored in the product management DB server 40, and the Internet server for customer 70 may retrieve the product management information from the product management DB server 40.

Figure 2:
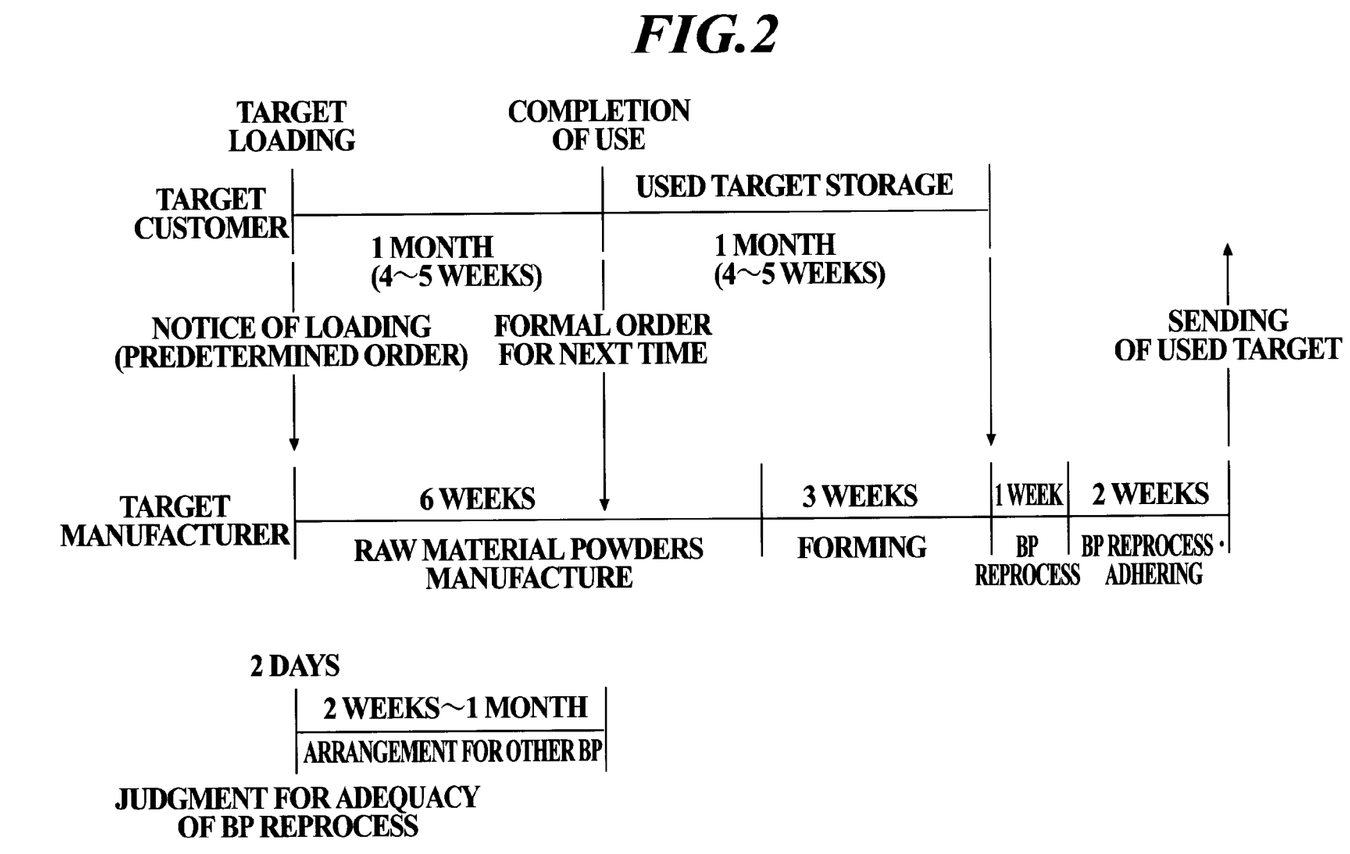
FIG. 2 is an explanatory illustration of a production process using the product management system according to the present invention.
Figure 3:
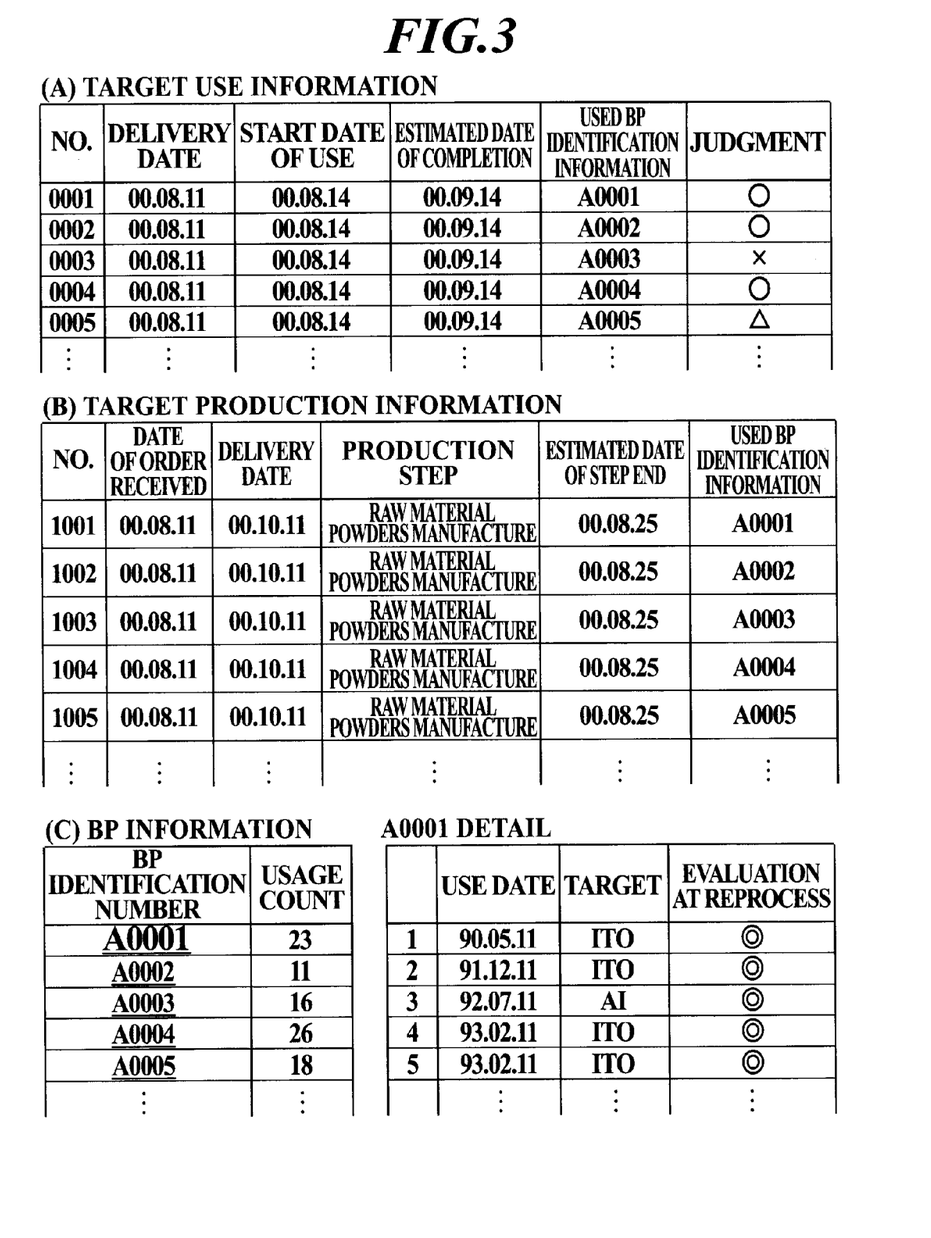
FIG. 3 are examples of data charts stored in a storage unit of the product management system according to the present invention.
Figure 4:
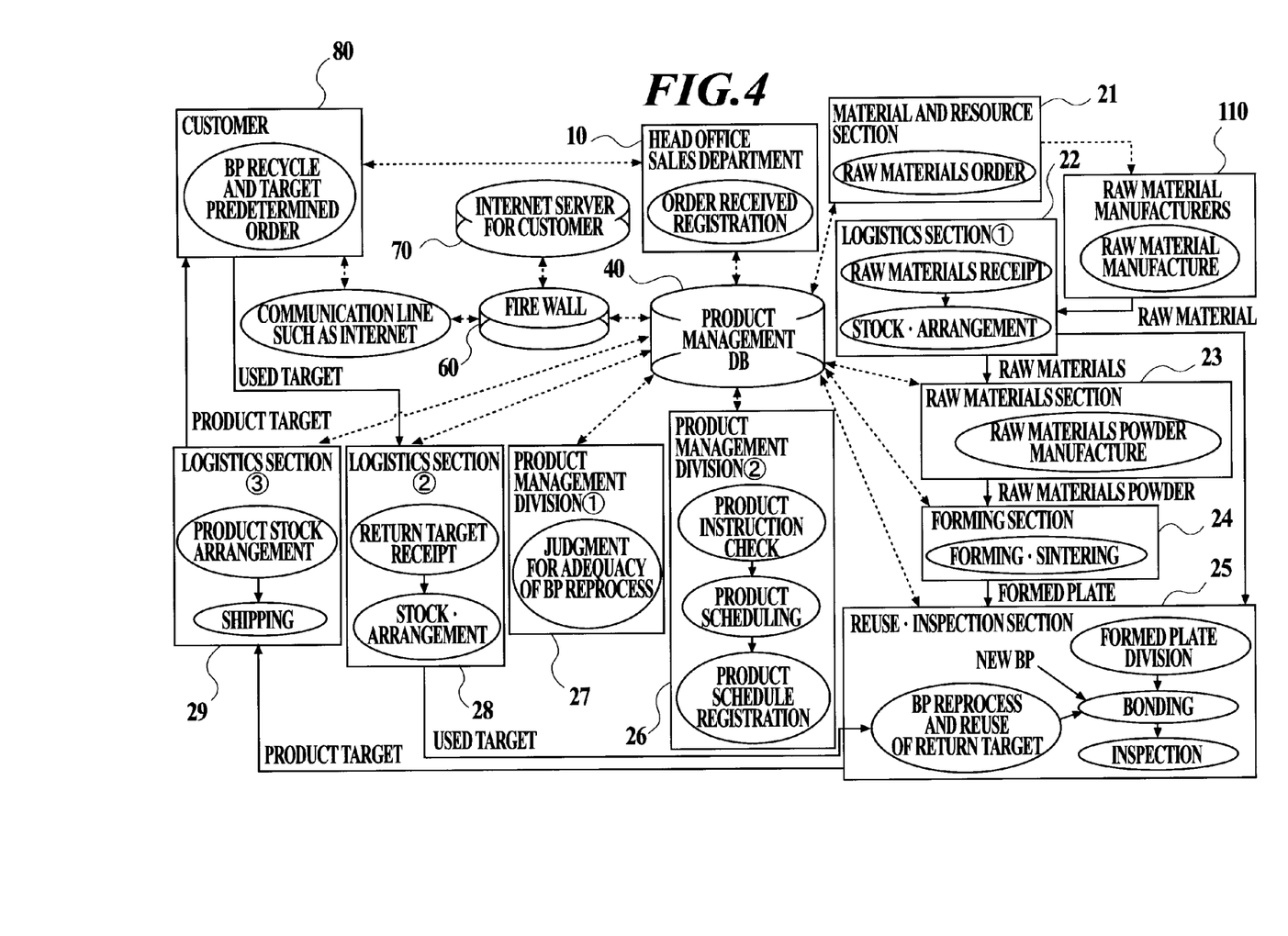
FIG. 4 is an explanatory illustration showing a flow of information and articles in the product management system according to the present invention.

Next, the flow of steps from the loading (start of the target use) of the sputtering targets in the customer to the next delivery of the sputtering targets will be explained with reference to FIG. 2 to FIG. 4. FIG. 2 is an explanatory illustration of the target production process which is achieved by applying the product management system according to the present invention. FIG. 3 are examples of data charts stored in the Internet server for customer 70 or the product management DB server 40. FIG. 4 is a schematic view showing a flow of information and articles (backing plates, targets or the like) in the product management system according to the present invention. The broken lines show the flow of the information, while the solid lines show the flow of the articles.

At first, the sputtering targets delivered from the manufacturer are loaded onto the sputtering apparatus by the customer 80. The identifying information, such as product number is marked on the sputtering target, while identifying information is incused on the backing plate used for the spattering target. Thus, it is possible to identify that which of the backing plates is used for which of the sputtering targets. The above information is stored in the Internet server for customer 70 or the product management DB server 40 in the form as shown in FIG. 3(A), for example.

The customer 80, based on the loading of the sputtering targets onto the sputtering apparatus, inputs or records (notice of the loading) the start date of use and the estimated date of depletion for the loaded sputtering targets on the Internet server for customer 70. Then, the database of expenditure information about the sputtering targets as shown in FIG. 3(A) is updated, based on the recorded information from the customer. At that time, the communication terminal device 80 on the customer is connected to the Internet server for customer via the firewall 60. When the customer accesses to the information about own sputtering targets, the accessor is required to input the identifying information of the registered customers (user ID and password). Only after the input identifying information is checked and it is authenticated that the present accessor is the valid user, the information about own sputtering targets is provided, and the information, such as the start date of use of the sputtering target can be recorded.

Accordingly, the manufacturer can know when the sputtering targets which are loaded by the customer at present will be completely used, and begin to arrange the raw material powders for the next targets or the like.

Based on the notice of loading from the customer, the manufacturer performs the judgment whether the backing plate used for the loaded sputtering target is reusable or not. The result of the judgment, for example, ○, △, or X is input and recorded on the judgment field of the target use information (FIG. 3(A)).

Specifically, as shown in FIG. 4, the product management division ①27 judges whether the backing plate used for the loaded sputtering target is reusable or not based on the reprocess information of BP stored in the product management DB server 40. Then, the product management division ① 27 inputs the result of the judgment for reprocess adequacy, so that the data of the target use information DB stored in the product management DB server 40 is updated.

The reprocess information of BP includes the identifying information of BP by which the respective backing plates are identifiable, and the hysteresis information of BP showing how the respective backing plates have been used. Specifically, the reprocess information of BP shows the information stored in the form as shown in FIG. 3(C). In the embodiment, the hysteresis information of BP (usage count) is stored corresponding to the respective backing plates (identifying information of BP) (left side in FIG. 3(C)), and further detailed hysteresis information of BP every backing plate is stored (right side in FIG. 3(C)). The hysteresis information of BP includes, for example, types of targets, usage count, scratch or warp or curve on the adhering surface to the backing plate material, the last judgment for adequacy of reuse or the like.

In the embodiment, based on the notice of loading of the sputtering target from the customer, the judgment for reuse is carried out for the backing plate used for the loaded sputtering target. However, for example, when the manufacturer has produced the sputtering target, the judgment for reuse may be carried out for the backing plate used for the produced sputtering target. Further, a program for the judgment for next reuse of the backing plate based on the reprocess information of BP may be installed to the Internet server for customer such that the Internet server for customer automatically carries out the judgment.

Accordingly, the customer can access to the Internet server for customer 70, and view the expenditure information or the like about the sputtering target delivered to the customer. Thus, the customer can know which of the backing plates used for the sputtering targets is reusable.

Generally, new backing plate is available by arrangement within from two weeks to one month. If the customer immediately arranges new backing plates based on the result of the judgment, they can be prepared within about nine weeks in which the manufacturer produces the raw material powders, and forms and sinters the target material.

If the result of the judgment for adequacy of the backing plate reuse is sent voluntarily from the product management DB server 40 to the customer through, for example, the sales department 10 of the head office, the customer can immediately know the result of the judgment, and immediately arrange new backing plates.

In the embodiment, the advance order information (types and quantity of targets, delivery date therefore or the like) is transmitted from the customer 80 to the Internet server for customer 70 at the time of the notice of loading. Then, the information stored in the product management DB is updated based on the transmitted information. Particularly, when the type of the target which will be produced for next time is different from that of the target which is used for this time, there is no wrong arrangement for raw material powders because the type or sort of the target as advance order information is sent from the customer to the manufacturer.

When the advance order information is sent to the Internet server for customer, the advance order information is transmitted to the communication terminal device on the product management division ② 26 on the manufacturer via the product management DB server 40. The product management division ② 26, based on the advance order information, makes plans for target production schedule which is sent to the communication terminal devices of each division or section.

The production schedule may be made automatically by the Internet server for customer 70 based on the advance order information. The production schedule made by the Internet server for customer 70 may be modified by staffs in each division or section after the schedule has transmitted to the respective communication terminal devices on the manufacturer. Thereby, each division or section can prepare for the sputtering targets production in advance, so that the sputtering targets can be produced smoothly.

According to the target production schedule, the manufacturer begins the produce of the raw material powders to be used for the next sputtering targets.

Particularly, at first, the material and resource section 21 orders the target raw material to the raw material manufacturer 110 according to the production schedule sent from the product management DB server 40, and at the same time, inputs the data of completion of the target raw material order to the product management DB server 40. The material and resource section 21 may also communicate with the raw material manufacturer 110 with analog data, such as telephone in addition to electrical communication.

After the produce of the target raw material in the raw material manufacturer 110, the logistics section ① 22 receives the produced target raw material, and inputs that the receipt of the target raw material has completed to the product management DB server 40.

The raw material section 23 is provided with the received target raw material. The raw material section 23 confects raw material powders, and at the same time, inputs or records producing state of the raw material powders to the product management DB server 40.

The forming section 24 is provided with the manufactured raw material powders. The forming section 24 forms and sinters the target raw material powders to produce the formed plate, and at the same time, inputs producing state of the formed plates to the product management DB server 40. Then, the reuse and inspection section 25 is provided with the formed plates of target material.

As described above, during the process of the sputtering target production on the manufacturer, the target product information in the product management DB server 40 is updated every production steps based on the information input from the communication terminal devices 21 to 24 on the respective divisions and sections. The customer can get the target product information, such as the one as shown in FIG. 3(B), in real time by connecting to the Internet server for customer 70. Thereby, the customer can know the present step in the target production (raw material powders manufacturing step in FIG. 3(B)), and when the step is completed.

The customer prepares for sending the spent sputtering targets to the manufacturer. The spent sputtering targets will be used for the backing plates of the next sputtering targets. When there is a nonreusable backing plate, the customer arranges another new backing plate. The customer takes action so that the target adhering step is carried out soon after the target forming step.

Normally, the sputtering targets loaded onto the sputtering apparatus are spent within four or five weeks. The customer formally orders the sputtering targets for next time to the manufacturer, for example, the sales department 10 in the head office, just before or after the complete consumption of the loaded sputtering targets.

As described above, because the manufacturer already begins to produce the raw material powders according to the advance order information from the customer, the producing of target raw material powders is completed after about two weeks from the formal order from the customer. Thereafter, the forming and sintering of target materials is carried out within about three weeks.

In the meantime the customer arranges sending of the spent sputtering targets, and then sends them in accordance with the time that the manufacturer has just formed and sintered the target materials. The logistics section ② 28 receives the spent sputtering targets sent from the customer, as shown in FIG. 4. The logistics section ② 28 inputs the receipt of the spent sputtering targets to the product management DB server 40, and at the same time, provides the reuse and inspection section 25 with the received, spent sputtering targets.

When there is a nonreusable backing plate in the spent sputtering targets, the customer asks, for example, the sales department 10 of the head office on the manufacturer to prepare a new backing plate. The manufacturer produces or prepares a new backing plate to provide the reuse and inspection section 25 with it. Alternatively, the customer may prepare a new backing plate, and send it to the manufacturer.

The reuse and inspection section 25 removes the erosion target material from the spent target provided from the logistics section ② 28, and cleans the backing plate. Thus, the backing plate is reprocessed. The reprocessed backing plate is inspected whether it is reusable or not. The reuse and inspection section 25 inputs the completion of the inspection to the product management DB server 40, and provides the bonding step with the reusable backing plates. The backing plates of the spent sputtering targets sent from the customer 80 are already judged that they are reusable from the hysteresis information of BP.
Accordingly, few backing plates reprocessed are judged that they are nonreusable by this inspection, and the arrangement for new backing plate is not required, so that the target products can be delivered on schedule.

In the reuse and inspection section 25, the formed plate of the target material is adhered (bonded) to the reprocessed backing plate or newly produced backing plate, so that the sputtering target as the product is manufactured. As shown in FIG. 2, this step for adhering of the formed plate of target material to the backing plate takes about two weeks.

The logistics section ③ 29 delivers the product sputtering targets to the customer, and inputs the completion of delivery to the product management DB server 40.

As described above, the product management information stored in the product management DB server 40 is updated in detail every production steps on the manufacturer. Thereby, the customer can get the production state of the ordered sputtering target, thus the customer can carry out the check, preparation, or the like of the sputtering target apparatus to be used for the next time according to the plan.

The embodiment of the present invention achieved by the inventors is explained concretely, however, the present invention is not limited to the above embodiment. For example, the communication terminal device on the customer is connected to the host computer on the manufacturer via the Internet and the public telephone network or the like in the embodiment. However, the communication terminal device on the customer may be connected to the host computer on the manufacturer via the exclusive line for the product management system.

Further, identifying information, such as magnetic ID, barcode or the like may be appended to the sputtering targets and backing plates. The identifying information may be read automatically with a reading unit.

That is, before the sputtering targets are loaded onto the sputtering apparatus, the identifying information of the sputtering targets to be used may be read with the reading unit on the customer, and then the notice of target loading and the identifying information of the sputtering targets may be automatically transmitted to the host computer. Instead, the following facility may be installed into the sputtering apparatus itself. The facility is the one that reads automatically the target identifying information about sputtering target at a time of loading, and transmits the notice of loading and the information to the predetermined computer.

On the other hand, on the manufacturer, the identifying information of the backing plates used for the sputtering targets may be read with the reading unit after production of the sputtering targets, and the hysteresis information of BP corresponding to the read identifying information may be updated automatically. At the same time, the identifying information of the backing plate may be read with the reading unit at the present step before the next step in the production process, thereby the product information of the sputtering target for which the backing plate is used may be updated automatically.

INDUSTRIAL APPLICABILITY

The present invention relates to a useful product management system applied to a production process for sputtering targets with process of reusing of backing plates. The present invention can be applied to a product management system of reusable products which are used by customer and then reprocessed by a manufacturer. The customer and the manufacturer share the various information with each other according to the present invention, so that the production efficiency can be improved.

What is claimed is:

1. A product management system for sputtering targets, comprising:

communication terminal devices on a plurality of sputtering target customers which orders a sputtering target used for forming a thin film on a predetermined object by a sputtering method;

a communication terminal device on a sputtering target manufacturer producing a sputtering target according to an order from the sputtering target customer; and a host computer managing an entire system, wherein each of the communication terminal devices on the sputtering target customers, the communication terminal device on the sputtering target manufacturer and the host computer is connected to each other via a predetermined communication line, the host computer comprises:

storage means for storing at least identifying information of registered customer for tracking down each of the plurality of sputtering target customers, identifying information for tracking down each backing plate which is used as a base of the sputtering target and to which a predetermined sputtering target material can be adhered, and hysteresis information recorded as a reused history of each backing plate, wherein the reused history includes a usage count of the backing plate used as a sputtering target, categories of material type, quality and product class about every target materials adhered to the backing plate; and customer authentication means for determining whether a present accessor is authorized user by checking the identifying information of registered customers, and wherein when the present accessor is authenticated by the customer authentication means, the communication terminal device on the sputtering target customer is capable of accessing to the information stored in the host computer, and the hysteresis information is added and updated with respect to each reprocess and reuse of the backing plate as a sputtering target based on information input from the communication terminal device on the sputtering target manufacturer.

2. The product management system for sputtering targets as claimed in claim 1, wherein product information for a production state on the sputtering target manufacturer is stored in the storage means, the production state includes the reprocess and reuse or new manufacture arrangement of a backing plate for a sputtering target ordered from the sputtering target customer, and the product information is updated with respect to each advance of the production process based on information input from the communication terminal device on the sputtering target manufacturer.

3. The product management system for sputtering targets as claimed in claim 1 or claim 2, wherein use information for a usage state on the target customer, of a sputtering target delivered from the target manufacturer is stored in the storage means, and the use information is updated with respect to each beginning to use a sputtering target loaded onto a sputtering apparatus, based on information input from the communication terminal devices on the sputtering target customer.

4. The product management system for sputtering targets as claimed in claim 1, wherein the communication terminal device is comprised of a plurality of communication terminal devices installed in respective divisions and sections relating to the production of the sputtering target, and each of them is connected to the host computer via communication means.

5. The product management system for sputtering targets as claimed in claim 1, wherein the system comprises a denial mechanism and means for preventing illegal access from a communication terminal device on an outsider who has no access right to the host computer.

6. A host computer used for a product management system for sputtering targets, to which communication terminal devices on a plurality of customers ordering a sputtering target used for forming a thin film on a predetermined object by a sputtering method and a communication terminal device on a target manufacturer producing a sputtering target according to an order from the sputtering target customer are capable of being connected via a predetermined communication line, and the host computer managing the entire system, the host computer comprising:

storage means for storing at least customer identifying information for tracking down each of the plurality of target customers, identifying information for tracking down each backing plate which is used as a base of the sputtering target and to which a predetermined sputtering target material can be adhered, and hysteresis information recorded as a reused history of each backing plate, wherein the reused history includes a usage count of the backing plate as a sputtering target, categories of material type, quality and product class about every target materials adhered to the backing plate; and customer authentication means for determining whether a present accessor is authorized user by checking the identifying information of registered customers, wherein the communication terminal devices on the sputtering target customers, when the present accessor is authenticated by the customer authentication means, are capable of accessing to the information stored in the host computer, and the hysteresis information is updated with respect to each reprocess and reuse of the backing plate as a sputtering target based on information input from the communication terminal device on the sputtering target manufacturer.

7. The host computer used for a product management system for sputtering targets as claimed in claim 6, further comprising a reprocess judgment means for judging adequacy of reuse of the backing plate based on the hysteresis information.

8. The host computer used for a product management system for sputtering targets as claimed in claim 6 or claim 7, further comprising production schedule planning means for planning a production schedule of the sputtering target based on advance order information transmitted from the target customer, the advance order information including material type, quality and product class to be used for manufacturing a next sputtering target and the identifying information of a backing plate to be recycled, wherein the planned production schedule is stored in the storage means, and transmitted to the communication terminal device on the target manufacturer.

9. A medium storing a program for product management system of a sputtering target, wherein the program is executed on a host computer managing the entire system, and communication terminal devices on a plurality of customers ordering a sputtering target used for forming a thin film on a predetermined object by a sputtering method and a communication terminal device on a manufacturer producing a sputtering target according to an order from the sputtering target customer are capable of being connected to the host computer via a predetermined communication line, and the program comprises:

means for managing product management information including at least identifying information for tracking down each of the plurality of target customers, identifying information for tracking down each backing plate which is used as a base of the sputtering target and to which a predetermined sputtering target materials can be adhered, and hysteresis information recorded as a reused history of each backing plate, wherein the reused history includes a usage count of the backing plate used as a sputtering target, categories of material type, quality and product class about every target materials adhered to the backing plate;

means for permitting a present accessor to access to the information stored in the host computer when the present accessor is authenticated by the customer authentication mechanism and means;

means for assisting input of the product management information from the communication terminal device on the sputtering target manufacturer or customer; and means for making the product management information stored in the host computer and the inputs of product management viewable on the communication terminal devices.

10. A program for product management system of a sputtering target, the program executed on a host computer managing the entire system, wherein communication terminal devices on a plurality of customers ordering a sputtering target used for forming a thin film on a predetermined object by a sputtering method and a communication terminal device on a manufacturer producing a sputtering target according to an order from the target customer are capable of being connected to the host computer via a predetermined communication network, the program comprising:

means for managing product management information including at least identifying information for tracking down each of the plurality of sputtering target customers, identifying information for tracking down each backing plate which is used as a base of the sputtering target and to which a predetermined target material can be adhered, and hysteresis information recorded as a reused history of each backing plate, wherein the reused history includes a usage count of the backing plate used as a sputtering target, categories of material type, quality and product class about every target materials adhered to the backing plate;

means for permitting a present accessor to access to the information stored in the host computer when the present accessor is authenticated by the customer authentication mechanism and means;

means for assisting input of the product management information from the communication terminal device on the sputtering target manufacturer or customers; and means for making the product management information stored in the host computer and the inputs of product management viewable on the communication terminal devices.

11. The product management system for sputtering targets as claimed in claim 1, wherein the communication terminal device is comprised of a plurality of communication terminal devices installed in respective divisions and sections relating to the production of the sputtering target, and each of them is connected to the host computer via a local area network.

* * * * *